United States Patent
Östlund et al.

(10) Patent No.: US 9,463,513 B2
(45) Date of Patent: Oct. 11, 2016

(54) COATED CUTTING TOOL

(71) Applicant: SANDVIK INTELLECTUAL PROPERTY AB, Sandviken (SE)

(72) Inventors: Åke Östlund, Hagersten (SE); Jonny Edman, Ronninge (SE); Erik Lindahl, Uppsala (SE); Jan Engqvist, Uppsala (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 331 days.

(21) Appl. No.: 14/315,463

(22) Filed: Jun. 26, 2014

(65) Prior Publication Data

US 2015/0003925 A1 Jan. 1, 2015

(30) Foreign Application Priority Data

Jun. 27, 2013 (EP) ..................... 13174011

(51) Int. Cl.
| | |
|---|---|
| C23C 14/08 | (2006.01) |
| B23B 27/14 | (2006.01) |
| C23C 16/02 | (2006.01) |
| C23C 16/36 | (2006.01) |
| C23C 16/40 | (2006.01) |
| C23C 16/56 | (2006.01) |
| C23C 30/00 | (2006.01) |

(52) U.S. Cl.
CPC ......... B23B 27/148 (2013.01); C23C 16/0254 (2013.01); C23C 16/0272 (2013.01); C23C 16/36 (2013.01); C23C 16/403 (2013.01); C23C 16/56 (2013.01); C23C 30/005 (2013.01); *B23B 2200/00* (2013.01); *B23B 2224/04* (2013.01); *B23B 2224/32* (2013.01); *Y10T 407/27* (2015.01)

(58) Field of Classification Search
USPC .......... 51/307, 309; 428/212, 336, 698, 701, 428/702
See application file for complete search history.

(56) References Cited

U.S. PATENT DOCUMENTS

| | | | | |
|---|---|---|---|---|
| 7,655,293 | B2 * | 2/2010 | Ljungberg | B24C 1/08 51/307 |
| 9,238,267 | B2 * | 1/2016 | Stiens | C23C 30/005 51/309 |
| 2006/0222885 | A1 | 10/2006 | Fukano et al. | |
| 2009/0214857 | A1 * | 8/2009 | Itoh | C23C 16/403 428/336 |
| 2012/0270037 | A1 * | 10/2012 | Paseuth | C23C 16/36 428/698 |

FOREIGN PATENT DOCUMENTS

| | | |
|---|---|---|
| EP | 1953258 A1 | 8/2008 |
| EP | 2570510 A1 | 3/2013 |
| WO | 2013037997 A1 | 3/2013 |

* cited by examiner

*Primary Examiner* — Archene Turner
(74) *Attorney, Agent, or Firm* — Corinne R. Gorski

(57) ABSTRACT

A coated cutting tool comprising substrate and a coating, wherein the coating comprises a layer of MTCVD TiCN, and a layer of $\alpha$-$Al_2O_3$, wherein the $\alpha$-$Al_2O_3$ layer exhibits an X-ray diffraction pattern, as measured using CuK$\alpha$ radiation, the (hkl) reflections used are (012), (104), (110), (113), (116), (300), (214) and (0 0 12), and the TC(0 0 12) is higher than 5 and a full width half maximum (FWHM) of a rocking curve peak of the (0 0 12) plane of the $\alpha$-$Al_2O_3$ is lower than 30°.

20 Claims, No Drawings

COATED CUTTING TOOL

RELATED APPLICATION DATA

This application claims priority under 35 U.S.C. §119 to EP Patent Application No. 13174011.0, filed on Jun. 27, 2013, which the entirety thereof is incorporated herein by reference.

TECHNICAL FIELD

The present invention relates to a coated cutting tool for chip forming machining of metals comprising a substrate having a surface coated with a chemical vapour deposition (CVD) coating. The coated cutting tool in accordance with the present invention is particular useful for turning steels, such as low alloyed steels, carbon steels and tough hardened steels.

BACKGROUND

Chemical Vapour Deposition (CVD) of wear resistant coatings on cemented carbide cutting tools has been an industrial practice for more than 30 years. Properties of coated inserts have been constantly improved during the years; life time and reliability in terms of resistance to edge fracture have been enhanced considerably. A noticeable improvement in performance of CVD-coated tool inserts came about when Ti(C,N) produced by the MTCVD (Moderate Temperature CVD)-technique begun to come into the tool industry about 10-15 years ago. An improvement in the toughness properties of the cutting tool insert was then obtained. Today the majority of tool producers use this technique. Today's modern tool coatings also include at least one layer of $Al_2O_3$ to achieve high wear resistance and to protect the carbide substrate from excessive heat during cutting.

EP1953258A1 discloses that a cutting tool provided with an α-alumina layer with a (001) texture, as measured by a strong (006) diffraction peak, results in an improved toughness and wear resistance of the cutting tool. The tendency for plastic deformation of the cutting edge was reduced.

WO2013/037997 discloses a cutting insert for turning in steel, comprising an α-$Al_2O_3$ layer with a (001) texture as measured by a strong (0 0 12) diffraction peak. The insert is subjected to a surface treatment of blasting to provide a specific stress state in the cutting insert.

SUMMARY

It is an aspect of the invention to provide an alumina coated cutting tool insert with improved performance in cutting operations. It is a further aspect of the invention to provide a coated cutting tool with improved wear resistance, for example a higher resistance to crater wear and an enhanced resistance to plastic deformation of the cutting edge. Another aspect of the invention is to provide a cutting tool with high performance in turning of steel, such as low alloyed steels, carbon steels and tough hardened steels.

The cutting tool in accordance with the present invention comprises a coated cutting tool comprising a substrate and a coating, wherein the coating comprises a layer of MTCVD TiCN, and a layer of α-$Al_2O_3$, wherein the α-$Al_2O_3$ layer exhibits an X-ray diffraction pattern, as measured using CuKα radiation and θ-2θ scan, wherein the texture coefficient TC(hkl) is defined, according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl)=measured (integrated area) intensity of the (hkl) reflection, $I_0$(hkl)=standard intensity according to ICDD's PDF-card No. 00-010-0173, n=number of reflections used in the calculation, (hkl) reflections used are (012), (104), (110), (113), (116), (300), (214) and (0 0 12), and wherein TC(0 0 12) is higher than 5, preferably higher than 6, most preferably higher than 7. A α-$Al_2O_3$ layer with a high TC(0 0 12) has shown to be advantageous as a layer on a cutting tools due to its high crater wear resistance and also its ability to reduce the tendency for plastic deformation of the cutting tool edge.

One way to study the texture in a coating is to use a so called rocking curve measurement, also called an ω scan. The principle for the measurements is to a fixed 2θ angle, corresponding to the d-value of a specific plane, and detecting the diffracted intensity as the sample is tilted (or "rocked"), i.e. the incidence angle ω is scanned. If the planes are perfectly aligned in parallel with the surface (ex in a single crystal) the Bragg condition will be fulfilled when the ω angle is half the 2θ angle and hence a peak will appear at a value corresponding to half the 2θ value. For a perfect single crystal the broadening of the peak will be equal to the divergence of the incident x-ray beam. A further broadening of the peak indicates that the layer comprises textured grains not perfectly aligned relative the surface of the substrate.

In the present invention, the α-$Al_2O_3$ shows a high TC(0 0 12), i.e. a strong 0 0 1 texture, and the degree of texture perfection through the whole α-$Al_2O_3$ layer was studied by analysing the rocking curve of the 0 0 12 plane.

One way of expressing the sharpness of the rocking curve is to calculate a full width half maximum (FWHM) value of a peak. A lower FWHM value corresponds to a more well textured coating throughout the whole α-$Al_2O_3$ layer.

Since a high 0 0 1 texture has shown advantageous in increased resistance to crater wear and resistance to plastic deformation, a high 0 0 1 texture throughout the whole, or at least the major part, of the coating thickness is considered advantageous. This has shown to be advantageous also in increased resistance to flank wear of the cutting edge.

The coating according to the present invention comprises an α-$Al_2O_3$-layer with a full width half maximum (FWHM) of a rocking curve peak of the (0 0 12) plane of the α-$Al_2O_3$ using X-ray diffraction as measured on the clearance face of the cutting tool is FWHM lower than 30°, preferably lower than 26°, more preferably lower than 22°.

The cutting tool in accordance with the present invention is for chip forming machining of metals and is preferably a turning insert. The substrate is the body which is coated by the surface coating. The body (.i.e the substrate) can be made of a cermet or cemented carbide. The body is in one embodiment of the present invention made of cemented carbide, wherein the cemented carbide comprise 4-15 wt % Co, preferably 6-8 wt % Co, and preferably 10-14 vol % cubic carbides of the metals from groups IV, V and VI of the periodic table, preferably Ti, Nb and Ta.

In one embodiment the cemented carbide substrate comprise a cobalt enriched surface zone from the interface between the body and the coating to a depth of 15-25 μm into the body being essentially free from cubic carbides, giving the cutting insert an excellent toughness with preserved resistance to plastic deformation.

In one embodiment of the present invention the α-Al$_2$O$_3$ layer is 2-15 μm, preferably 3-7 μm, most preferably 4-6 μm.

In one embodiment of the present invention the TiCN layer is 2-15 μm, preferably 5-12 μm, most preferably 7-11 μm.

In one embodiment of the present invention, the cutting tool has been subjected to a blasting treatment to increase the toughness properties of the coating. The blasting treatment affects the stress condition of the coating. A too hard blasting will lead to crack formation and chipping of the coating. The blasting impact force can be controlled by, e. g., the blasting pulp pressure, the design of the blasting nozzle, the distance between blasting nozzle and coating surface, type of blasting media, grain size of the blasting media, the concentration of the blasting media in blasting fluid and the impact angle of the blasting jet.

One way of measuring the stress state in the coating is by studying the broadening of a specific peak in an x-ray θ-2θ scan. The peak is typically wider for a coating with a stress gradient than for a coating without stress gradient. The measured peak width achieved after blasting of the coating will give an indirect measurement of the stress gradient in the coating if the peak width is compared to the peak width of the same peak measured from a coating as deposited.

The intuitive crystal plane to use for an analysis is the plane in parallel with the surface of the textured coating plane which is being in parallel with the substrate surface and preferably a peak at a high 2θ value. In this case the (0 0 12) peak is selected. The (0 0 12) peak is advantageous in that it has a position at a rather high angle, and therefore a small change in cell parameter gives a relatively large change in peak width.

The diffraction peak width of a blasted coating can be compared to the diffraction peak width of a non-blasted coating, or, of the same coating after stress relaxation by heat treatment as disclosed below. This difference is here defined as difference Δ, wherein difference Δ=FWHM(stressed)−FWHM(unstressed), i.e. the difference between the full width half maximum (FWHM) of the diffraction peak as subjected to blasting, and the full width half maximum (FWHM) of the diffraction peak in a state as prior to blasting. For example, on a cutting tool comprising a clearance face and a rake face, and wherein only the rake face have been blasted, the diffraction peak of the clearance face can be compared to the corresponding diffraction peak of the rake face.

In one embodiment of the present invention a stress state in the α-Al$_2$O$_3$ layer is changed from its as-deposited stress state, and whereby the shape of the 2θ (0 0 12) diffraction peak have changed such that the difference Δ becomes Δ>0.20, preferably Δ>0.3, more preferably Δ>0.4, or Δ>0.5, or Δ>0.6 or Δ>0.7. A blasting is preferably performed, preferably with Al$_2$O$_3$ grains. The angle between the beam of the blaster slurry from the blasting gun to cutting tool surface during blasting, and the cutting tool surface can for example be 70-110°, preferably about 90°.

In one embodiment of the present invention a difference Δ between the FWHM of the (0 0 12) diffraction peak in an X-ray diffraction of the α-Al$_2$O$_3$ on the rake face of the cutting tool and the FWHM of the (0 0 12) diffraction peak in an X-ray diffraction of the α-Al$_2$O$_3$ on the clearance face of the cutting tool is Δ>0.2, preferably Δ>0.3, most preferably Δ>0.4, or Δ>0.5, or Δ>0.6 or Δ>0.7. This way of measuring the difference Δ is suitable if the insert is for example blasted on its rake face.

In one embodiment of the present invention a difference Δ between the FWHM of the (0 0 12) diffraction peak in an X-ray diffraction of the α-Al$_2$O$_3$ and the FWHM of the (0 0 12) diffraction peak in an X-ray diffraction of a cutting tool after heat treatment in 1030° C. in N$_2$ in 3 hours is Δ>0.2, preferably Δ>0.3, most preferably Δ>0.4, or Δ>0.5, or Δ>0.6 or Δ>0.7. This way of measuring the difference Δ is useful if the insert for example has been blasted on all its outer surfaces.

If a non-blasted surface is not available as a reference surface, a blasted insert can be heat treated at 1030° C. in an N$_2$ atmosphere for 3 hours in order to bring back the original stress state, i.e. to become comparable to the non-blasted state. This is demonstrated in Example 7

It is to be noted that the stress state of the coating after a CVD process, i.e. as coated or as deposited, is not free of residual stresses. Usually a CVD coating on a cemented carbide substrate is subjected to residual tensile stresses, giving cracks in the CVD coating. The heat treatment as disclosed above is to retransform the CVD coating to a stress state corresponding to the one as prior to blasting.

In one embodiment of the present invention the TiCN layer exhibits an X-ray diffraction pattern, as measured using CuKα radiation, wherein the relation between the integrated area intensity of the 220 peak (I$_{220}$) and the integrated area intensity of the 311 peak (I$_{311}$), I$_{220}$/I$_{311}$, is lower than 3, preferably lower than 2, most preferably lower than 1.5, or lower than 1, or lower than 0.5 or lower than 0.3. This has shown to be preferred to obtain a strong 0 0 1 texture throughout the whole α-Al$_2$O$_3$ layer. To obtain such TiCN MTCVD-layers it is beneficial to use volume ratios of TiCl$_4$/CH$_3$CN higher than 2 in the MTCVD-process.

In one embodiment the TiCN layer exhibits an X-ray diffraction pattern, as measured using CuKα radiation, wherein the relation between the integrated area intensity of the 220 peak (I$_{220}$) and the integrated area intensity of the 422 peak (I$_{311}$), I$_{220}$/I$_{422}$, is lower than 3, preferably lower than 2, most preferably lower than 1.5, or lower than 1, or lower than 0.5 or lower than 0.3.

The foregoing summary will be better understood when read in conjunction with the following detailed description of the embodiments. It should be understood that the embodiments depicted are not limited to the precise arrangements and instrumentalities shown.

DETAILED DESCRIPTION OF PREFERRED EMBODIMENTS

Examples of embodiments of the present invention will now be disclosed in more detail.

Example 1

Coating Deposition

Sample A (Invention)

Coated cutting tools (inserts) in accordance with one embodiment of the invention were manufactured. Cemented carbide substrates of ISO-type CNMG120408 for turning were manufactured from 7.2 wt-% Co, 2.7 wt % Ta, 1.8 wt % Ti, 0.4 wt % Nb, 0.1 wt % N and balance WC, comprising a Co enriched surface zone of about 25 μm from the substrate surface and to a depth into the body being essentially free from cubic carbides.

The substrates were subjected to a CVD coating process in a radial Ion bond type CVD equipment 530 size capable of housing 10000 half-inch size cutting inserts.

The inserts were first coated with a thin approximately 0.4 µm TiN-layer then with a 9 µm TiCN layer by employing the well-known MTCVD technique using TiCl$_4$, CH$_3$CN, N$_2$, HCl and H$_2$ at 885° C. The volume ratio of TiCl$_4$/CH$_3$CN during the MTCVD deposition of the TiCN layer were 2.2.

On top of the MTCVD TiCN layer was a 1-25 µm thick bonding layer deposited at 1000° C. by a process consisting of three separate reaction steps. First a TiCN step using TiCl$_4$, CH$_4$, N$_2$, HCl and H$_2$ at 400 mbar, then a second step using TiCl$_4$, CH$_3$CN, CO, N$_2$, HCl and H$_2$ at 70 mbar and finally a third step using TiCl$_4$, CH$_3$CN, AlCl$_3$, CO, N$_2$ and H$_2$ at 70 mbar.

Prior to the start of the Al$_2$O$_3$ nucleation, the bonding layer was oxidized for 4 minutes in a mixture of CO$_2$, CO, N$_2$ and H$_2$.

The Al$_2$O$_3$ layer was deposited at 1000° C. and 55 mbar in two steps. The first step using 1.2 vol-% AlCl$_3$, 4.7 vol-% CO$_2$, 1.8 vol-% HCl and balance H$_2$ giving about 0.1 µm Al$_2$O$_3$ and the second step using 1.2% AlCl$_3$, 4.7% CO$_2$, 2.9% HCl, 0.6% H$_2$S and balance H$_2$ giving a total Al$_2$O$_3$ layer thickness of about 5 µm.

An outermost colour layer comprising TiN was applied with a thickness of about 1 µm.

Sample B (Reference)

Coated inserts were manufactured in a process as corresponding to the one for Sample A, except that a different CVD coating deposition process was used as disclosed below.

The inserts were first coated with a thin approximately 0.4 µm TiN-layer and then with a 9 µm TiCN-layer by employing the well-known MTCVD technique using TiCl$_4$, CH$_3$CN, N$_2$, H$_2$ and optionally with some HCl-addition at 885° C. The volume ratio of TiCl$_4$/CH$_3$CN was kept higher than 2 during the TiCN layer deposition.

On top of the MTCVD TiCN layer was an a 1-2 µm thick bonding layer deposited at 1000° C. using two separate reaction steps. First a TiCN step using TiCl$_4$, CH$_4$, N$_2$ and H$_2$ at 55 mbar, then a second step using TiCl$_4$, CO and H$_2$ at 55 mbar pressure.

Prior to the start of the Al$_2$O$_3$ nucleation, the bonding layer was oxidized by a mixture of CO$_2$, HCl and H$_2$ for a short period of time, about 2 min.

The Al$_2$O$_3$ layer was deposited at 1000° C. and 55 mbar in two steps. During the first step the following gasses were used: 1.2 vol-% AlCl$_3$, 4.7 vol-% CO$_2$, 1.8 vol-% HCl and H$_2$ balance giving about 0.1 µm Al$_2$O$_3$. The second step was using 1.2 vol-% AlCl$_3$, 4.7 vol-% CO$_2$, 2.9 vol-% HCl, 0.35 vol-% H$_2$S and H$_2$ balance giving a total Al$_2$O$_3$ layer thickness of about 5 µm.

An outermost colour layer comprising TiN was applied with a thickness of about 1 µm.

Example 2

Blasting

The blasting was performed on the rake faces of the cutting tools. The blaster slurry consisted of 20 vol-% alumina in water and an angle of 90° between the rake face of the cutting insert and the direction of the blaster slurry. The distance between the gun nozzle and the surface of the insert was about 145 mm. The pressure of the slurry to the gun was 1.8 bar for all samples, while the pressure of air to the gun was 2.1 bar (blasting treatment 1), 2.2 bar (blasting treatment 2) or 2.5 bar (blasting treatment 3). The alumina grits were F220 mesh (FEPA 42-1:2006). The average time for blasting per area unit was 4.4 seconds. Three different blasting treatments were evaluated for Sample A. Sample A treated with the blasting treatment 1 is hereafter called Sample A1, and if treated with blasting treatment 2 called Sample A2, and if treated with blasting treatment 3 called Sample A3. Sample B were blasted with blasting treatment 2 (Sample B2).

Example 3

TC(0 0 2) Measurements of α-Al$_2$O$_3$ Layer

Cu—K$_\alpha$ X-rays were used for the measurements. The mirrors attached to the microfocus X-ray source focus the beam to about 0.8×0.8 mm without pinhole collimator. Measurements were done with a voltage of 50 kV and a current of 1 mA, resulting in a maximum power of 50 W. A pinhole collimator of 0.5 mm was used in order to be able to measure on small flat areas on the inserts rake face. The diffracted intensity from the sample was measured with three images, each with the area detector at different 2θ positions, resulting in diffraction information between 15 and 105° in 2θ. The images were thereafter merged in Brukers EVA (V3.0) software and converted to 1D diffractograms by integrating in what in the Bruker software was defined as Gamma direction.

In order to investigate the texture of the α-Al$_2$O$_3$ layer X-Ray diffraction was conducted using CuK$_\alpha$ radiation and texture coefficients TC (hkl) for different growth directions of the columnar grains of the α-Al$_2$O$_3$ layer were calculated according to Harris formula:

$$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl)=measured (integrated area) intensity of the (hkl) reflection, I$_0$(hkl)=standard intensity according to ICDD's PDF-card no 00-010-0173, n=number of reflections to be used in the calculation. In this case the (hkl) reflections used are: (0 1 2), (1 0 4), (1 1 0), (1 1 3), (1 1 6), (2 1 4), (3 0 0) and (0 0 12).

The data analysis, including background subtraction, Cu—K$_{\alpha 2}$ stripping and profile fitting of the data, was done using PANalytical's X'Pert HighScore Plus software. The output (integrated peak areas for the profile fitted curve) from this program were then used to calculate the texture coefficients of the α-Al$_2$O$_3$ by comparing the ratio of the measured intensity data to the standard intensity data (PDF record no. 10-0173), using the Harris formula. Since the α-Al$_2$O$_3$ layer was a finitely thick film the relative intensities of a pair of peaks at different 2θ angles are different than they are for bulk samples, due to the differences in path length through the α-Al$_2$O$_3$. Therefore, thin film correction was applied to the integrated peak area intensities for the profile fitted curve, taken into account also the linear absorption coefficient of α-Al$_2$O$_3$, when calculating the TC values. Since possible further layers above the α-Al$_2$O$_3$ layer will affect the X-ray intensities entering the α-Al$_2$O$_3$ layer and exiting the whole coating, corrections need to be made for these as well. taken into account the linear absorption coefficient for the respective compound in a layer. Alternatively, a further layer, such as TiN, above the alumina layer can be removed by a method that does not substantially influence the XRD measurement results, e.g. etching.

The TC(0 0 12) values for the α-Al₂O₃ layer of Sample A1, A2, A3 and B2, as measured on the rake face, are shown in Table 2.

Example 4

Area Intensity Measurements, $I_{220}/I_{311}$, of TiCN

The equipment used for XRD measurements of the TiCN layer was the same as for the α-Al₂O₃ TC measurements in Example 3 using the same methodology and equipment parameters. In this case the unblasted clearance face was measured.

In order to investigate the peak intensities (integrated peak area) of the TiCN layer X-Ray diffraction was conducted using CuK$_α$ radiation.

The data analysis, including background subtraction, Cu—K$_{α2}$ stripping and profile fitting of the data, was done using PANalytical's X'Pert HighScore Plus software. The output from this program was integrated peak areas for the profile fitted curve. Since the TiCN layer was a finitely thick film the relative intensities of a pair of peaks at different 2θ angles are different than they are for bulk samples, due to the differences in path length through the TiCN layer. Therefore, thin film correction was applied to the integrated peak area intensities for the profile fitted curve, taken into account also the linear absorption coefficient of TiCN. Since possible further layers above the TiCN layer will affect the X-ray intensities entering the TiCN layer and exiting the whole coating, corrections need to be made for these as well, especially if their thickness is substantial, in this case the α-Al₂O₃ layer and the upper TiN layer, taken into account the linear absorption coefficient for the respective compound in a layer.

It is to be noted that peak overlap is a phenomenon that can occur in X-ray diffraction analysis of coatings comprising for example several crystalline layers and/or that are deposited on a substrate comprising crystalline phases, and this has to be considered and compensated for by the skilled person. A peak overlap of peaks from the α-Al₂O₃ layer with peaks from the TiCN layer might influence the $I_{220}/I_{311}$ and/or the $I_{220}/I_{422}$. It is also to be noted that for example WC in the substrate can have diffraction peaks close to the relevant peaks of the present invention.

The area intensity values (corrected values) for TiCN are shown in Table 1.

TABLE 1

(Intensity relations)

| TiCN | $I_{220}$ | $I_{311}$ | $I_{220}/I_{311}$ |
| --- | --- | --- | --- |
| Sample A1 | 8.2 | 20.3 | 0.4 |
| Sample A2 | 12.3 | 17.2 | 0.7 |
| Sample A3 | 11.4 | 18.3 | 0.6 |
| Sample B2 | 6.1 | 5.6 | 1.1 |

Example 5

Rocking Curve Measurements

Rocking curve measurements were performed in a Philips MRD (Materials Research Diffractometer). The diffractometer was operated in line focus with CuKα (both α1 och α2) radiation. The incidence optics was an x-Ray mirror with a divergence of 0.04° and a cross slit collimator. The diffracted side optics was a 0.27° parallel plate collimator and a gas proportional point detector. At a Fixed 2θ angle of 90.665°, ω was scanned between 6.3 and 69.3° with a step size of 1° and 10 s/step in continuous mode. The outer layer, such as TiN, above the alumina layer can be removed by a method that does not substantially influence the XRD measurement results, e.g. etching. Since the α-Al₂O₃ layer is of finite thickness the path length of the x-ray beam within the α-Al₂O₃ layer will be different as a function of the omega angle, which the intensity data needs to be corrected for. This can be done by taking the thickness and linear absorption coefficient into account as described for example by Birkholz (Thin Film Analysis by X-ray Scattering, 2006, Wiley-VCH Verlag, ISBN 3-527-31052-5, chapter 5.5.3, pages 211-215).

The results from the rocking curve measurements, as measured on the clearance face, are shown in Table 2

Example 6

Difference Δ between the FHWM (0 0 12) Peaks in θ-2θ Scan

The FWHM of the (0 0 12) diffraction peak in an x-Ray diffraction θ-2θ scan, corresponding to the one disclosed in Example 3, was measured, on the blasted rake face and on the not blasted clearance face.

The difference Δ between the FHWM of the (0 0 12) peak in the θ-2θ scan on the rake face and the FWHM of the (0 0 12) peak in the θ-2θ scan on the clearance face (not blasted) was measured in the graphs. The results are shown in Table 2, presented as difference Δ=FWHM(rake)−FWHM (clearance).

TABLE 2

(Blasting)

| α-Al₂O₃ | TC (0 0 12) rake face blasted | Rocking curve FWHM of (0 0 12) clearance face (°ω) | Blasting parameters (pressure (MPa)/ time (seconds)) | Difference Δ (FWHM (rake) − FWHM (clearance)) (°2θ) |
| --- | --- | --- | --- | --- |
| Sample A1 | 7.42 | 18.7 | 2.1/4.4 | 0.27 |
| Sample A2 | 7.42 | 20.5 | 2.2/4.4 | 0.59 |
| Sample A3 | 7.31 | 20.3 | 2.5/4.4 | 0.84 |
| Sample B2 | 5.4 | 36 | 2.2/4.4 | 0.46 |

Example 7

Heat Treatment

To verify that a heat treatment transforms a blasted coating back to its stress state as prior to blasting, the following experiment was performed. A cutting insert that had been treated by blasting at its rake face showed a difference Δ=FWHM(rake)−FWHM(clearance) of 0.51. The insert was heat treated for 3 hours at 1030° C. in N₂. After the heat treatment the difference Δ=FWHMN(rake)−FWHM (clearance) was 0.08. A corresponding heat treatment can therefore be used in case the insert is not only blasted on the rake face, but also on the clearance face, to produce a coating that is similar to that of a not blasted clearance face.

Example 8

Crater Wear Test

The coated cutting tools as blasted in accordance with Example 2, i.e. Samples A1, A2, A3, B2, were tested in longitudinal turning in ball bearing steel (100CrMo7-3) using the following cutting data;

Cutting speed $v_c$: 220 m/min

Cutting feed, f: 0.3 mm/revolution

Depth of cut, $a_p$: 2 mm

Insert style: CNMG120408-PM

Water miscible metal working fluid was used.

One cutting edge per cutting tool was evaluated.

In analyzing the crater wear, the area of exposed substrate was measured, using a light optical microscope. When the surface area of the exposed substrate exceeded 0.2 mm² the life time of the tool was considered to be reached. The wear of each cutting tool was evaluated after 2 minutes cutting in the light optical microscope. The cutting process was then continued with a measurement after each 2 minutes run, until the tool life criterion was reached. When the size of the crater area exceeded 0.2 mm² the time until the tool life criterion was met was estimated based on an assumed constant wear rate between the two last measurements. Beside crater wear, flank wear was also observed, but did not in this test influence the tool life. The results are shown in Table 3.

Example 9

Toughness Test

The coated cutting tools of Example 2, i.e. Samples A1, A2, A3, B2 were tested in a toughness test.

The work piece material consist of two carbon steel bars (Fe 360C), mounted parallel to each other with a distance between them. In longitudinal turning of this work piece the cutting tool will be exposed to two interruptions per revolution. In this test the toughness of the cutting tool has shown to be critical for its lifetime.

The following cutting data was used;

Cutting speed $v_c$: 80 m/min

Depth of cut $a_p$: 1.5 mm

Water miscible metal working fluid was used.

The cutting feed was increased linearly. The start value was 0.15 mm/revolution. After 1 minute of cutting the feed value was 0.30 mm/revolution and after 2 minutes of cutting, the feed value was 0.45 mm/revolution.

An equipment for measuring the cutting forces was used. When an insert breakage occurred the cutting force increased clearly and the machine was stopped. 15 cutting edges were evaluated per sample. The actual value of the cutting feed at breakage for each one of the 15 cutting edges was registered. The values were sorted from the lowest fracture feed value to the highest, for each cutting edge. The results are show in table 3, presenting the feed at fracture for edge number 3, the median value of all 15 edges and the value for edge number 13.

TABLE 3

(Wear performance)

| $\alpha\text{-Al}_2\text{O}_3$ | Crater wear test (min) | Toughness test Feed at fracture (mm/revolution) | | |
|---|---|---|---|---|
| | | 3rd | Median | 13th |
| Sample A1 | 34.7 | 0.24 | 0.26 | 0.30 |
| Sample A2 | 31.7 | 0.29 | 0.33 | 0.36 |
| Sample A3 | 36.7 | 0.48 | 0.57 | 0.60 |
| Sample B2 | 28.9 | 0.27 | 0.30 | 0.32 |

The crater wear test shows that an $\alpha\text{-Al}_2\text{O}_3$ layer with a TC(0 0 12) of about 7.4, a FWHM of a rocking curve of about 20 and a $I_{220}/I_{311}$ value of about 0.4-0.7 gives a higher crater wear resistance than an $\alpha\text{-Al}_2\text{O}_3$ layer with a TC(0 0 12) of about 5.4, a FWHM of a rocking curve of about 36 and a $I_{220}/I_{311}$ value of about 1.1.

The toughness test shows that a blasting sufficient to give a difference $\Delta$ larger than 0.2 results in a well performance cutting tool. Further, as shown by the results, a higher blasting pressure gives a tougher cutting tool.

Although the present embodiments have been described in relation to particular aspects thereof, many other variations and modifications and other uses will become apparent to those skilled in the art. It is preferred therefore, that the present embodiment(s) be limited not by the specific disclosure herein, but only by the appended claims.

The invention claimed is:

1. A coated cutting tool comprising:
a substrate; and
a coating, the coating including a layer of MTCVD TiCN, and a layer of $\alpha\text{-Al}_2\text{O}_3$, wherein the $\alpha\text{-Al}_2\text{O}_3$ layer exhibits an X-ray diffraction pattern, as measured using CuKα radiation and θ-2θ scan, wherein a texture coefficient TC(hkl) is defined according to the Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl)=measured intensity (integrated area) of the (hkl) reflection,
$I_0$(hkl)=standard intensity according to ICDD's PDF-card No. 00-010-0173,
n=number of reflections used in the calculation, and the (hkl) reflections used are (012), (104), (110), (113), (116), (300), (214) and (0 0 12),
and wherein TC(0 0 12) is higher than 5, and wherein a full width half maximum (FWHM) of a rocking curve peak of a (0 0 12) plane of the $\alpha\text{-Al}_2\text{O}_3$ using X-ray diffraction as measured on a clearance face of the cutting tool is FWHM lower than 30°, and wherein the TiCN layer exhibits an X-ray diffraction pattern, as measured using CuKα radiation, wherein the relation between the integrated area intensity of a 220 peak and the integrated area intensity of a 311 peak, $I_{220}/I_{311}$, is lower than 3.

2. The cutting tool in accordance with claim 1, wherein a difference A between the FWHM of a (0 0 12) diffraction peak in an X-ray diffraction of the $\alpha\text{-Al}_2\text{O}_3$ layer on a rake face of the cutting tool and the FWHM of the (0 0 12) diffraction peak in an X-ray diffraction of the α-Al$_2$O$_3$ on the clearance face of the cutting tool is Δ>0.2.

3. The cutting tool in accordance with claim 2, wherein a difference Δ>0.3.

4. The cutting tool in accordance with claim 2, wherein a difference Δ>0.4.

5. The cutting tool in accordance with claim 1, wherein a difference Δ between the FWHM of the (0 0 12) diffraction peak in an X-ray diffraction of the α-Al$_2$O$_3$ layer and the FWHM of the (0 0 12) diffraction peak in an X-ray diffraction of the cutting tool after heat treatment in 1030° C. in N$_2$ for 3 hours is Δ>0.2.

6. The cutting tool in accordance with claim 5, wherein a difference Δ>0.3.

7. The cutting tool in accordance with claim 5, wherein a difference Δ>0.4.

8. The cutting tool in accordance with claim 1, wherein the α-Al$_2$O$_3$ layer is 2-15 μm.

9. The cutting tool in accordance with claim 8, wherein the α-Al$_2$O$_3$ layer is 3-7 μm.

10. The cutting tool in accordance with claim 8, wherein the α-Al$_2$O$_3$ layer is 4-6 μm.

11. The cutting tool in accordance with claim 1, wherein the TiCN layer is 2-15 μm.

12. The cutting tool in accordance with claim 11, wherein the TiCN layer is 5-12 μm.

13. The cutting tool in accordance with claim 11, wherein the TiCN layer is 7-11 μm.

14. The cutting tool in accordance with claim 1, further comprising a 1-2 μm thick bonding layer between the MTCVD TiCN layer and the layer of α-Al$_2$O$_3$.

15. The cutting tool in accordance with claim 1, wherein TC(0 0 12) is higher than claim 6.

16. The cutting tool in accordance with claim 1, wherein TC(0 0 12) is higher than claim 7.

17. The cutting tool in accordance with claim 1, wherein a full width half maximum (FWHM) of a rocking curve peak of the (0 0 12) plane of the α-Al$_2$O$_3$ using X-ray diffraction as measured on the clearance face of the cutting tool is FWHM lower than 26°.

18. The cutting tool in accordance with claim 1, wherein a full width half maximum (FWHM) of a rocking curve peak of the (0 0 12) plane of the α-Al$_2$O$_3$ using X-ray diffraction as measured on the clearance face of the cutting tool is FWHM lower than 22°.

19. The cutting tool in accordance with claim 1, wherein the relation between the integrated area intensity of the 220 peak and the integrated area intensity of the 311 peak, $I_{220}/I_{311}$, is lower than 2.

20. The cutting tool in accordance with claim 1, wherein the relation between the integrated area intensity of the 220 peak and the integrated area intensity of the 311 peak, $I_{220}/I_{311}$, is lower than 1.

* * * * *